(12) United States Patent
Sancon

(10) Patent No.: US 12,334,133 B2
(45) Date of Patent: Jun. 17, 2025

(54) ROW HAMMER REFRESH OPERATION

(71) Applicant: Micron Technology, Inc., Boise, ID (US)

(72) Inventor: John Christopher M. Sancon, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 353 days.

(21) Appl. No.: 17/959,664

(22) Filed: Oct. 4, 2022

(65) Prior Publication Data
US 2023/0395121 A1 Dec. 7, 2023

Related U.S. Application Data

(60) Provisional application No. 63/348,465, filed on Jun. 2, 2022.

(51) Int. Cl.
*G11C 11/406* (2006.01)
*G11C 11/4078* (2006.01)

(52) U.S. Cl.
CPC .. *G11C 11/40618* (2013.01); *G11C 11/40615* (2013.01); *G11C 11/4078* (2013.01)

(58) Field of Classification Search
CPC ........ G11C 11/40618; G11C 11/40615; G11C 11/4078; G11C 11/407
USPC ....................................................... 365/222
See application file for complete search history.

(56) References Cited

U.S. PATENT DOCUMENTS

| | | | |
|---|---|---|---|
| 9,236,110 B2 | 1/2016 | Bains et al. | |
| 9,286,964 B2 | 3/2016 | Halbert et al. | |
| 9,685,240 B1 | 6/2017 | Park | |
| 11,568,917 B1 * | 1/2023 | Shin | G11C 11/4078 |
| 2014/0059287 A1 | 2/2014 | Bains et al. | |
| 2020/0090729 A1 * | 3/2020 | Son | G06F 3/0604 |
| 2023/0395116 A1 * | 12/2023 | Veches | G11C 11/40622 |
| 2024/0096391 A1 * | 3/2024 | Cho | G11C 11/40622 |
| 2024/0135980 A1 * | 4/2024 | Lee | G11C 11/40603 |

* cited by examiner

*Primary Examiner* — Connie C Yoha
(74) *Attorney, Agent, or Firm* — Brooks, Cameron & Huebsch, PLLC

(57) ABSTRACT

Systems, apparatuses, and methods related to a row hammer refresh operation are described herein. An example apparatus can include an array of memory cells of a memory device. The array of memory cells can include a plurality of dies and at least one of the plurality of dies is a row hammer die. The example apparatus can include a memory controller coupled to the array of memory cells. The memory controller can perform a number of operations on the array of memory cells. The memory controller can detect a quantity of accesses associated with the row hammer die and based on the number of operations performed. The memory controller can, in response to detection of a threshold quantity of accesses of a group of memory cells in the row hammer die, perform a refresh operation on a group of memory cells in an additional die of the plurality of dies.

20 Claims, 5 Drawing Sheets

ROW HAMMER REFRESH OPERATION

PRIORITY INFORMATION

This application claims the benefit of U.S. Provisional Application Ser. No. 63/348,465 filed on Jun. 6, 2022, the contents of which are incorporated herein by reference.

TECHNICAL FIELD

The present disclosure relates generally to apparatuses, systems, and methods for performing a row hammer refresh operation.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Memory devices can be coupled to a host (e.g., a host computing device) to store data, commands, and/or instructions for use by the host while the computer or electronic system is operating. For example, data, commands, and/or instructions can be transferred between the host and the memory device(s) during operation of a computing or other electronic system.

DETAILED DESCRIPTION

Figure 1:
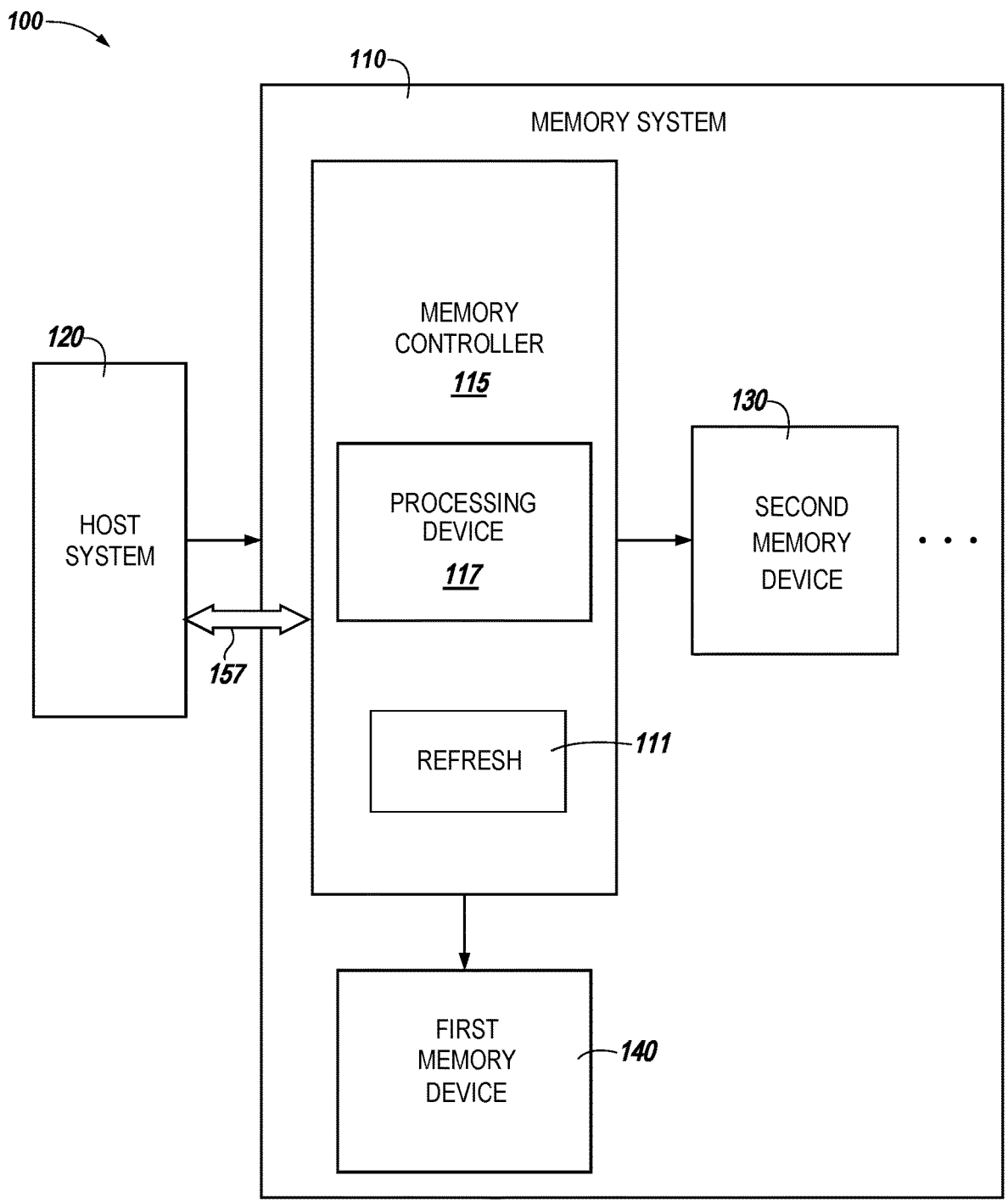
FIG. 1 illustrates an example computing system that includes a memory system in accordance with a number of embodiments of the present disclosure.

Systems, apparatuses, and methods related to a row hammer refresh operation are described herein. Memory cells of a memory device can be programmed to a target (e.g., desired) data state. For instance, an electric charge can be placed on or removed from a charge storage structure (e.g., a floating gate or a replacement gate) of a memory cell in a page to program the memory cell to a particular data state (e.g., to store data). In order to increase device reliability, a refresh operation can be performed on a data pattern of a row of data stored in the memory device to refresh the data (e.g., a "0" initially stored in a memory cell can be refreshed to a "0" again and a "1" initially stored in a memory cell can be refreshed to a "1" again). Refresh operations are generally performed as background operations and are common to DRAM memory devices. In DRAM, each data value (e.g., bit) is stored as the presence or absence of charge on a capacitor. As time passes, the charge can leak away and may be lost without refresh operations. For example, a DRAM cell may be refreshed by charging a capacitor serving as the charge storage structure for the cell to a particular voltage.

In some embodiments, in response to a row hammer trigger event, which can be triggered in response to detection of a row hammer attack, a memory controller can perform (or cause performance of) a refresh operation on groups of memory cells (e.g., a target row of memory cells). Row hammer attacks generally refer to security exploits that take advantage of an unintended and undesirable side effect in which memory cells interact electrically between themselves by leaking their charges, possibly changing the contents of nearby memory rows that were not addressed in the original memory access. A row hammer trigger event can refer to the occurrence of a row hammer attack occurring and/or can refer to a particular threshold of charge leakage that may occur. A refresh operation can be used to correct or rectify the adverse effects of the row hammer attack and/or charge leakage.

The disturbance of nearby memory rows can be referred to as a "row disturb event." A row disturb event refers to undesirable changes in capacitor voltages of DRAM cells of a neighboring row in response to the given row being frequently accessed. As an example, a hacker or other such nefarious entity may employ row disturb events to intentionally alter data stored in memory by repeatedly accessing a particular row in rapid succession. Refreshing the cells at a faster rate (e.g., more frequently) can improve the reliability of the data stored in the memory cells by canceling out the adverse effects of frequent accesses involving neighboring row(s). However, determining which group of cells (e.g., rows of cells) to perform a refresh on can add additional memory space allocation, power resources, etc., to monitor and detect the number of accesses of the group of memory cells. As an example, when performing a refresh operation, a row address for performing the refresh operation is determined and a refresh command is sent to perform the refresh operation. In order to know which row address to perform the refresh operation on, monitoring and detection of a quantity of accesses of the group of memory cells can be performed. In response to the quantity of accesses of the group of memory cells reaching a threshold quantity of accesses, the refresh operation can be performed.

In some previous approaches, each die of a plurality of dies (e.g., each die of a multi-die package) can include memory allocated and circuitry dedicated to monitoring and detecting the quantity of accesses of the memory cells within each of the dies of the plurality of dies. By monitoring and detecting each of the dies, additional memory space, power consumption, and processing resources may be allocated for each die. In order to address these and other issues associated with some previous approaches, at least one embodiment of the present disclosure provides for detecting less than all of the dies in a plurality of dies that have corresponding address locations.

As used herein, a single die (e.g., referred to herein as a "row hammer die") of the plurality of dies can include the capability to monitor and detect the quantity of accesses of the memory cells within that single die. This detection can be performed on the single die of a plurality of dies and not on the other dies of the plurality of dies. The addresses of the single die can correspond to the addresses of each of the plurality of dies such that each group of cells at each particular row address is accessed an equal or similar amount of times. Therefore, a quantity of accesses of a particular row of cells in the single die (e.g., the row hammer die) can indicate an equal quantity of accesses of a different row that corresponds to the address in a different die of the sets of dies other than the single die. In this way, the row hammer refresh is referred to as deterministic because the performance of the row hammer refresh is based on a detected quantity of accesses and not on estimation or sampling of the memory cells.

Further, expanded out, a plurality of sets of dies (e.g., a plurality of multi-die packages) can include a row hammer die for each set of dies and an alert signal can be sent from the row hammer die of any one of the plurality of sets of dies. The alert signal can indicate to perform a refresh operation on the addresses that correspond to the alert signal. The addresses for each of the plurality of sets of dies can correspond to each other such that an alert signal indicates a quantity of accesses for each of the plurality of sets of dies. In this way, a single detection of threshold quantity of accesses in one die can cause a refresh operation to be performed not only in each corresponding address in the plurality of dies in a package but also for each of the plurality of sets of dies (each of the packages) at each corresponding location.

The memory cells of each of the dies are part of a memory system (such as the memory system 110 in FIG. 1). In some embodiments, the memory system can be a Compute Express Link (CXL) compliant memory system (e.g., the memory system can include a PCIe/CXL interface). CXL is a high-speed central processing unit (CPU)-to-device and CPU-to-memory interconnect designed to accelerate next-generation data center performance. CXL technology maintains memory coherency between the CPU memory space and memory on attached devices, which allows resource sharing for higher performance, reduced software stack complexity, and lower overall system cost.

CXL is designed to be an industry open standard interface for high-speed communications, as accelerators are increasingly used to complement CPUs in support of emerging applications such as artificial intelligence and machine learning. CXL technology is built on the peripheral component interconnect express (PCIe) infrastructure, leveraging PCIe physical and electrical interfaces to provide advanced protocol in areas such as input/output (I/O) protocol, memory protocol (e.g., initially allowing a host to share memory with an accelerator), and coherency interface. In some embodiments, the CXL technology can include a plurality of I/O lanes configured to transfer the plurality of commands to or from circuitry external to the memory controller at a rate of around thirty-two (32) giga-transfers per second. In another embodiments, the CXL technology can comprise a peripheral component interconnect express (PCIe) 5.0 interface coupled to a plurality of I/O lanes, wherein the memory controller is to receive commands involving at least one of a memory device, a second memory device, or any combination thereof, via the PCIe 5.0 interface according to a compute express link memory system.

In the following detailed description of the present disclosure, reference is made to the accompanying drawings that form a part hereof, and in which is shown by way of illustration how one or more embodiments of the disclosure can be practiced. These embodiments are described in sufficient detail to enable those of ordinary skill in the art to practice the embodiments of this disclosure, and it is to be understood that other embodiments can be utilized and that process, electrical, and structural changes can be made without departing from the scope of the present disclosure.

As used herein, a "set of memory cells" or "set" refers to a physical arrangement of memory cells such as a row of memory cells or a portion of a row of memory cells, among other possible configurations of memory cells. As used herein, a "set of memory dies" refers to a multi-die package. As used herein, a "row of memory cells" or "row" refers to an arrangement of memory cells that can be activated together (e.g., via access lines). Each row can include a number of pages. As used herein, the term "page" and "pages of memory cells" can be interchangeably used. As used herein, a "page" refers to a unit of programming and/or sensing (e.g., a number of memory cells that are programmed and/or sensed together as a functional group). In some embodiments each row (or a subset of a row) can comprises one page of memory cells.

As used herein, designators such as "M," "R," "J," "S," "U," etc., for example, particularly with respect to reference numerals in the drawings, indicate that a number of the particular feature can be included. It is also to be understood that the terminology used herein is for the purpose of describing particular embodiments only and is not intended to be limiting. As used herein, the singular forms "a," "an," and "the" can include both singular and plural referents, unless the context clearly dictates otherwise. In addition, "a number of," "at least one," and "one or more" (e.g., a number of sound devices) can refer to one or more sound devices, whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to." The terms "coupled," and "coupling" mean to be directly or indirectly connected physically or for access to and movement (transmission) of commands and/or data, as appropriate to the context.

The figures herein follow a numbering convention in which the first digit or digits correspond to the figure number and the remaining digits identify an element or component in the figure. Similar elements or components between different figures can be identified by the use of similar digits. A group or plurality of similar elements or components can generally be referred to herein with a single element number. For example, a plurality of reference elements 203-0, . . . 203-M (e.g., 203-0 to 203-M) can be referred to generally as 203. As will be appreciated, elements shown in the various embodiments herein can be added, exchanged, and/or eliminated so as to provide a number of additional embodiments of the present disclosure. In addition, the proportion and/or the relative scale of the elements provided in the figures are intended to illustrate certain embodiments of the present disclosure and should not be taken in a limiting sense.

FIG. 1 illustrates an example computing system 100 that includes a memory system 110 in accordance with a number of embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example. In some embodiments, the computing system 100 can include a memory system 110 including a memory controller 115 and memory devices 130, 140. The computing system 100 can be coupled to a host system 120.

In some embodiments, the memory controller 115 can be configured to manage a DRAM memory device. The memory devices 130, 140 can provide main memory for the computing system 100 or could be used as additional memory or storage throughout the computing system 100. In some embodiments, the memory devices 130, 140 can be a ferroelectric field-effect transistor (FeFET) memory device. In another embodiment, the memory devices 130, 140 can be a dynamic random-access memory (DRAM), ferroelectric random-access memory (FeRAM), or a resistive random-access memory (ReRAM) device, or any combination thereof. The memory devices 130, 140 can include one or more arrays of memory cells, e.g., volatile and/or non-volatile memory cells. In various embodiments, the memory devices 130, 140 can include at least one array of volatile memory cells. Embodiments are not limited to a particular type of memory device. For instance, the memory devices can include RAM, ROM, DRAM, SDRAM, PCRAM, RRAM, and flash memory, among others. Although shown as two memory devices 130, 140, it will be appreciated that a single memory device or three or more memory devices, are contemplated within the scope of the disclosure.

As described herein, the memory device 140 (and in some embodiments the memory device 130, although not illustrated) includes a refresh component 111 that stores address locations of memory cells. A component can refer to hardware and/or circuitry used to perform a number of operations. The refresh component 111 can be used to cause performance a refresh operation and/or to coordinate performance of the refresh operation.

A memory system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory systems 110. In some embodiments, the host system 120 is coupled to different types of memory system 110. The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory system 110, for example, to perform a command. As used herein, the term "command" refers to an instruction from a memory system to perform a task or function. For example, the memory controller 115 of the memory system 110 can cause a processing device 117 to perform a task based on a given command. In some embodiment, a command can include a memory request. That is, a command can be a request to read and/or write data from and/or to the memory device (e.g., second memory device 130 and/or first memory device 140). The host system 120 may, for example, write data to the memory system 110 and read data from the memory system 110 based on a command (e.g., memory request).

The host system 120 can be coupled to the memory system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory system 110. The host system 120 can further utilize an NVM Express (NVMe) interface to access components (e.g., memory devices 130, 140) when the memory system 110 is coupled with the host system 120 by the PCIe interface. The physical host interface can provide an interface for passing control, address, data, and other signals between the memory system 110 and the host system 120. In general, the host system 120 can access multiple memory systems via a same communication connection, multiple separate communication connections, and/or a combination of communication connections.

In various embodiments, the memory controller 115 may generate status information, which may be transferred to or from host system 120, for example via the sideband channel 157. The sideband channel 157 may be independent of (e.g., separate from) a double data rate (DDR) memory interface and/or a non-volatile memory express (NVMe) interface that may be used to transfer (e.g., pass) DDR commands and/or NVM commands between the host system 120 and the memory device 110. That is, in some embodiments, the sideband channel 157 may be used to transfer commands to cause performance of bit vector operations from the host system 120 to the memory device 110 while a control bus (not illustrated) is used to transfer DRAM commands and/or NVM commands from the host system 120 to the memory device 110. The memory devices 130, 140 can include any combination of the different types of non-volatile memory devices and/or volatile memory devices. Examples of volatile memory devices can be, but are not limited to, random access memory (RAM), such as dynamic random-access memory (DRAM) and synchronous dynamic random-access memory (SDRAM).

Some examples of non-volatile memory devices can include, but are not limited to, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130, 140 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130, 140 can be grouped as pages that can refer to a logical unit of the memory device used to store data. In some embodiments, pages of memory cells can be comprised of one or more rows of memory cells. In addition, a row of memory cells can be comprised of one or more sets of memory cells.

The memory controller 115 (or controller 115 for simplicity) can communicate with the memory devices 130, 140 to perform operations such as reading data, writing data, or erasing data at the memory devices 130, 140 and other such operations. The memory controller 115 can include hardware such as one or more integrated circuits and/or discrete components, a buffer memory, or a combination thereof. The hardware can include digital circuitry with dedicated (i.e., hard-coded) logic to perform the operations described herein. The memory controller 115 can be a microcontroller, special purpose logic circuitry (e.g., a field programmable gate array (FPGA), an application specific integrated circuit (ASIC), etc.), or other suitable processor.

While the example memory system 110 has been illustrated in FIG. 1 as including the memory controller 115, in another embodiment of the present disclosure, a memory system 110 does not include a memory controller 115, and can instead rely upon external control (e.g., provided by an external host, or by a processor or controller separate from the memory system).

In general, the memory controller 115 can receive commands or operations from the host system 120 and can convert the commands or operations into instructions or appropriate commands to achieve the desired access to the memory device 130 and/or the memory device 140. The memory controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address (PBA), physical media locations, etc.) that are associated with the memory devices 130, 140. The memory controller 115 can further include host interface circuitry to communicate with the host system 120 via the physical host interface. The host interface circuitry can convert the commands received from the host system into command instructions to access the second memory device 130 and/or the first memory device 140 as well as convert responses associated with the second memory device 130 and/or the first memory device 140 into information for the host system 120.

The memory system 110 can also include additional circuitry or components that are not illustrated. In some embodiments, the memory system 110 can include a cache or buffer (e.g., DRAM) and address circuitry (e.g., a row decoder and a column decoder) that can receive an address from the memory controller 115 and decode the address to access the second memory device 130 and/or the first memory device 140.

As discussed herein, the memory system 110 (and/or constituent components thereof, such as memory cells of the first memory device 140 and/or memory cells of the second memory device 130, etc.) can experience charge leakage and/or parasitic currents due to repeated access of a set of memory cells. In some instances, charge leakage and/or parasitic currents can cause data corruption in a page associated with the set of memory cells and/or cause the page associated with the set of memory cells to wear-out. In some embodiments, the memory controller 115 can detect and mitigate errors in data due to charge leakage and/or parasitic currents using an error detection operation and/or monitoring a quantity of accesses (e.g., programs/erases, etc.) of the memory cells. A refresh operation can be performed on memory cells whose parameters exceed a threshold parameter (e.g., whose quantity of accesses exceed a threshold quantity of accesses, whose quantity of errors exceeds a quantity of errors, etc.).

For example, in some embodiments, the memory controller 115 can receive an indication that a parameter (e.g., a quantity of accesses) of a set of memory cells (e.g., a row of memory cells) has reached a threshold. In response, the memory controller 115 can cause a refresh operation to be performed on the set of memory cells. To perform the refresh operation, the memory controller 115 can send a command to precharge an additional set of memory cells that may be open or active to deactivate the additional set of memory cells. The memory controller 115 can store an address location associated with the set of memory cells to perform the refresh operation in a refresh component 111. When sending a refresh command, the refresh component 111 can be used to determine which set of memory cells associated with which address location to perform the refresh operation. The refresh component 111 can be used to coordinate detection and/or monitoring of the quantity of accesses of a group (e.g., row) of memory cells. The detection and/or monitoring may only occur in a single die of a plurality of dies, thereby avoiding expending resources on the detection and/or monitoring of accesses on the dies of the plurality of dies other than the single die.

Figure 2:
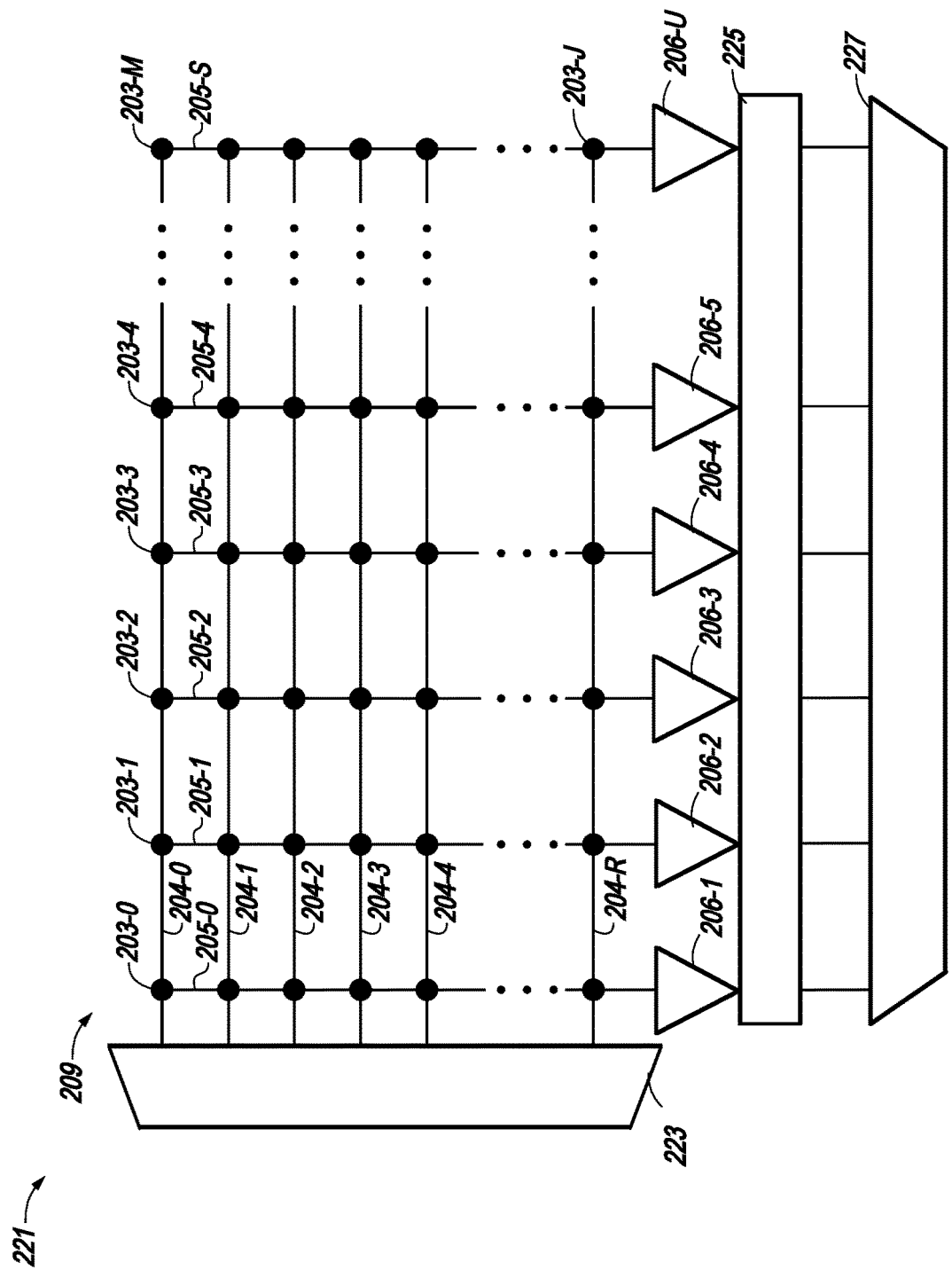
FIG. 2 illustrates an example functional diagram that includes memory cells arranged in rows in accordance with a number of embodiments of the present disclosure.

FIG. 2 illustrates an example functional diagram 221 that includes memory cells arranged in rows in accordance with a number of embodiments of the present disclosure. The functional diagram 221 can be used in connection with the computer system (e.g., the computer system 100 of FIG. 1). The components illustrates in the functional diagram 221 can be within a number of memory devices (e.g., the memory devices 130, 140 in FIG. 1). The functional diagram can include an array 209 of memory cells 203-0 to 203-M, a row decoder 223, a row buffer 225, a plurality of sense amplifiers 206-1 to 206-U, and a multiplexer 227.

The array 209 includes memory cells (referred to generally as memory cells 203, and more specifically as memory cells 203-0 to 203-M and/or to 203-J) coupled to rows of access lines 204-0, 204-1, 204-2, 204-3, 204-4, . . . , 204-R (referred to generally as access lines 204) and columns of sense lines 205-205-1, 205-2, 205-3, 205-4, . . . , 205-S (referred to generally as sense lines 205). Further, the array 209 of memory cells is not limited to a particular number of access lines and/or sense lines, and use of the terms "rows" and "columns" does not intend a particular physical structure and/or orientation of the access lines and/or sense lines.

Although not pictured, each column of memory cells can be associated with a corresponding pair of complementary sense lines.

Each column of memory cells can be coupled to a number of respective sense amplifiers 206-1, 206-2, 206-3, 206-4, 206-5, . . . , 206-U coupled to the respective sense lines 205-0, 205-1, 205-2, 205-3, 205-4, . . . , 205-S. Each of the respective sense amplifiers 206 are coupled to a row buffer 225 used to store the data accessed from the memory cells 203. As an example, the memory cells 203 can be selectively activated through decode lines to transfer data sensed by respective sense amplifiers 206-0 to 206-U to the row buffer 225.

In some embodiments, a memory controller (such as the memory controller 115 in FIG. 1) can receive a first command and initiate a first activation on a first row of cells coupled to access line 204-0). The activation of the first row of cells can initiate a memory access of one or more memory devices. As used herein, activation of a row can include activation of all the rows or an activation of a subset of the rows. For instance, activation of a row can include activating all transistors of each cell 203-0 to 203-M in a row or can include activating some but not all transistors on a row (a subset of cells 203-0 to 203-M). Activation of a row (or similarly activation of a subset of a row) can permit information to be stored on or accessed from the row.

In some embodiments, as illustrated in FIG. 2, a multiplexer 227 can be used to select particular data in the row buffer 225 that corresponds to a column of cells. As an example, a row address can be input to the row decoder 223 to indicate which row to access and a column address can be input to the multiplexer 227 to indicate which data associated with a column in the row buffer 225 to select so that particular data from a particular cell can be selected. The selected data can be transferred out via the multiplexer 227. For example, the memory controller can alter the logic state (e.g., switch the logic state from a "1" to a "0"). However, as used herein logic states are not limited to "1" or "0" and can include other values/types of logic states.

Figure 3:
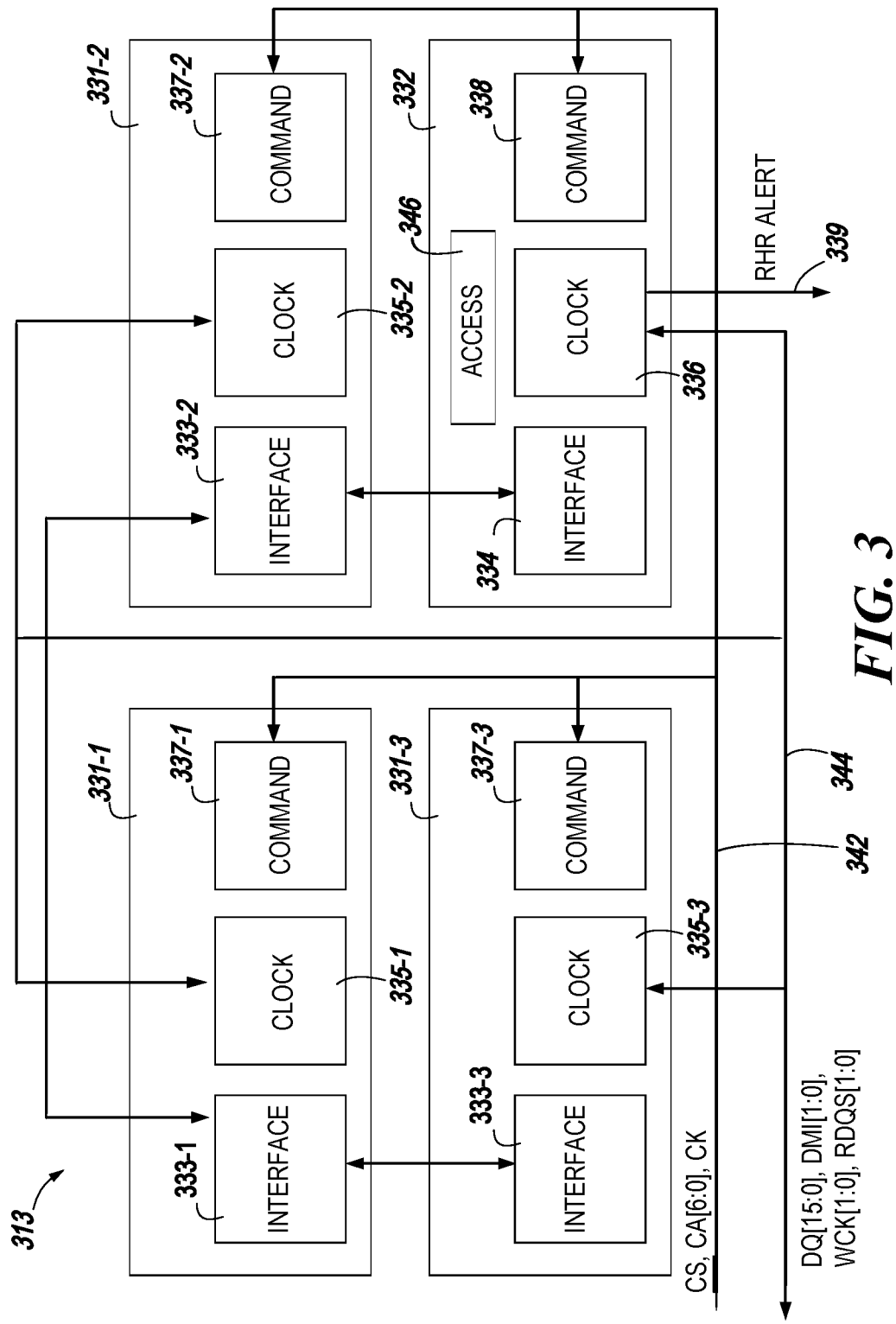
FIG. 3 is an example block diagram of a set of dies including a row hammer die in accordance with a number of embodiments of the present disclosure.

FIG. 3 is an example block diagram of a set of dies 313 including a row hammer die 332 in accordance with a number of embodiments of the present disclosure. In some embodiments, the set of dies 313 can be a multi-die package. As an example, a multi-die package can refer to a memory design that includes memory partitioned into multiple smaller dies—often referred to as chiplets or tiles—and integrated in a single package to achieve the expected power and form factor goals. The set of dies 313 can include a plurality of dies 331-1, 331-2, 331-3 (hereinafter referred to collectively as 331), and 332 where a single die 332 of the plurality of dies 331, 332 is referred to as a "row hammer die."

Each of the plurality of dies 331, 332 can include a respective interface component 333, 334, clock component 335, 336, and command component 337, 338. For example, a first die 331-1 of the plurality of dies 331, 332 can include a first interface component 333-1, a second die 331-2 can include a second interface component 333-2, a third die 331-3 can include a third interface component 333-3, and a fourth die 332 can include a fourth interface component 334 (wherein the first, second, third, and fourth interface components 333-1, 333-2, 333-3, and 334 are collectively referred to herein as interface components 333, 334). Further, a first die 331-1 of the plurality of dies 331, 332 can include a first clock component 335-1, a second die 331-2 can include a second clock component 335-2, a third die 331-3 can include a third clock component 335-3, and a fourth die 332 can include a fourth clock component 336 (wherein the first, second, third, and fourth interface components 333-1, 333-2, 333-3, and 334 are collectively referred to herein as clock components 335, 336). Furthermore, a first die 331-1 of the plurality of dies 331, 332 can include a first command component 337-1, a second die 331-2 can include a second command component 337-2, a third die 331-3 can include a third command component 337-3, and a fourth die 332 can include a fourth command component 338 (wherein the first, second, third, and fourth interface components 333-1, 333-2, 333-3, and 334 are collectively referred to herein as command components 337, 338).

In some embodiments, the interface components 333, 334 can store internal interface data and include control pads. The clock components 335, 336 can include clock pads and can store data related to the clock pads. The command components 337, 338 can include command and chip control pads. Each of the corresponding interface components 333, 334 can be coupled to each other (as illustrated, and while not illustrated for ease of illustration in FIG. 3, interface components 333-3 and 334 are also coupled together). Each of the corresponding clock components 335, 336 are coupled to the clock signal line 344. The clock signal line 344 can transfer signal data including DQ[15:0], DMI[1:0], WCK[1:0], RDQS[1:0]. The DQ[15:0] bits refers to the data input and output pins. The DMI[1:0] bits can be used as additional or extra data input and output pins or can be used as data masking or data inversion (e.g., for the DQ[15:0] or as internal ECC pins where the mode registers can configure the functionality of the DMI). The WCK[1:0] bits refer to clocks that latch the data into the DQ[15:0] during a memory write operation or data out of the DQ[15:0] during a memory read operation. The RDQS[1:0] bits are strobe signals accompanying the DQ[15:0] during a memory read operation. Each of the command components 337, 338 are coupled to the address line 342. The address line 342 can transfer address data including CS, CA[6:0], CK. The CS bits refer to the chip select pin (e.g., enables the die or dice). The CA[6:0] bits refer to the command address pins. The CK bits refer to the main clock signal of the die.

The die 332 can include access circuitry 346 used to detect and/or monitor a quantity of accesses of groups of memory cells. For example, the access circuitry 346 can detect and/or monitor a quantity of accesses of a row of memory cells and communicate with a refresh component (e.g., refresh component 111 in FIG. 1) of a memory controller (e.g., memory controller 115 in FIG. 1) to coordinate performance of a refresh operation. The refresh operation can be triggered in response to detection that a particular group of cells of the die 332 has been accessed a particular quantity of times. The address locations of the groups of memory cells within die 332 can correspond or correlate to the address locations to the groups of memory cells in each of dies 331-1, 331-2, 331-3 such that when a particular address location in die 332 is detected as being accessed a threshold quantity of times, the corresponding address locations in dies 331 can be selected for performance of the refresh operation as well. In some examples, an alert signal (e.g., a row hammer refresh ("RHR") alert) 339 can be sent from the die 332 which alerts the memory controller (and, in some examples, more specifically the refresh component 111 in FIG. 1) to cause performance of the refresh operations at the particular address locations within the dies 331, 331, 332. Even the particular address locations of the dies 331 that do not include the access circuitry can have a refresh operation performed in response to the alert signal 339 being sent. In this way, the dies 331 can save memory space and processing resources by not including the access circuitry and still receive refresh operations in line with those indicated by the row hammer die 332 (which does include the access circuitry 346).

Figure 4:
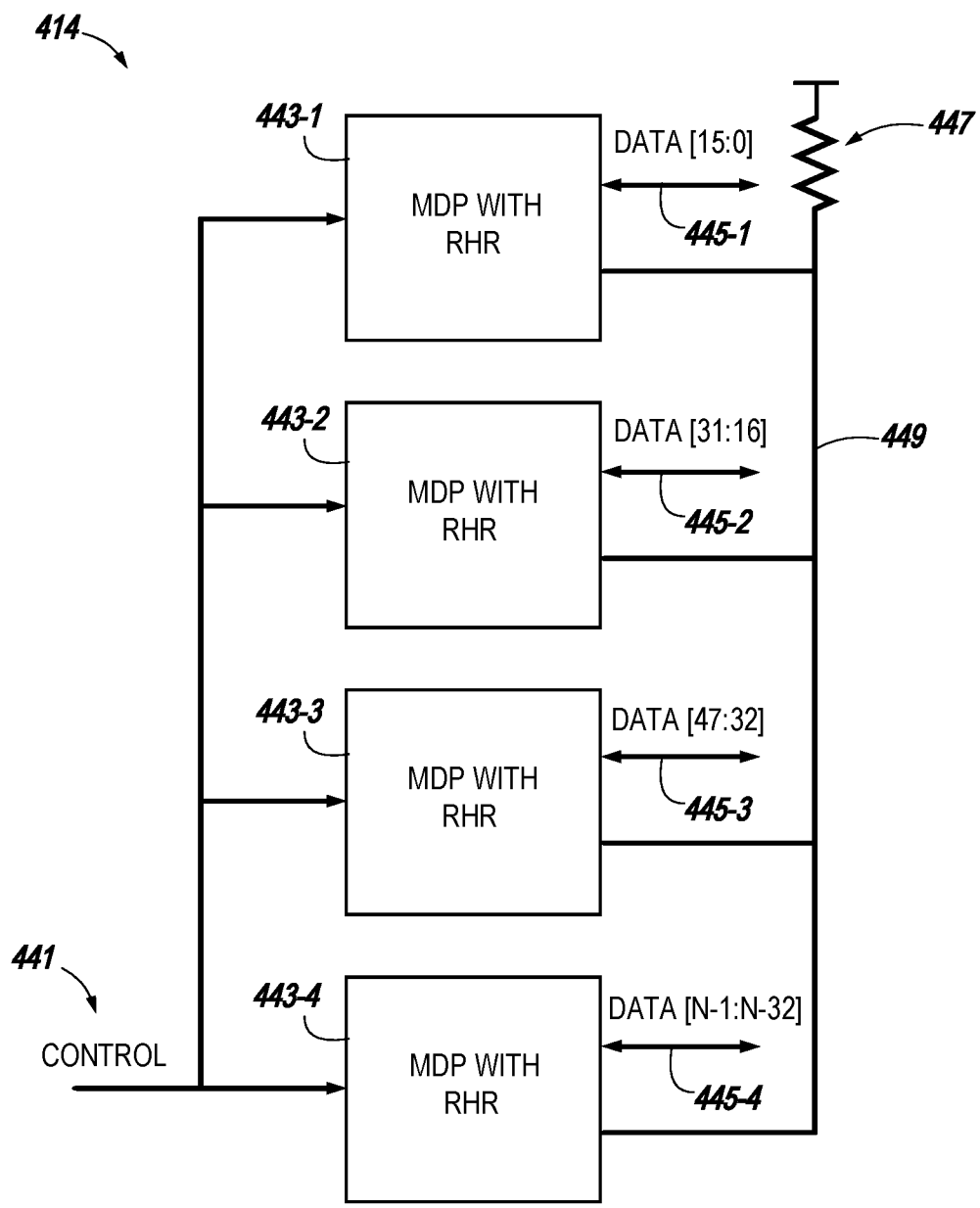
FIG. 4 is an example functional block diagram of a plurality of sets of dies each including a row hammer die in accordance with a number of embodiments of the present disclosure.

FIG. 4 is an example functional block diagram 414 of a plurality of sets of dies 443-1, 443-2, 443-3, 443-4 (hereinafter referred to collectively as plurality of sets of dies 443) each including a row hammer die in accordance with a number of embodiments of the present disclosure. Each of the plurality of sets of dies 443 can be a multi-die package ("MDP") including a row hammer refresh ("RHR") die. In some examples, the plurality of sets of dies 443 may be within a memory module. Each of the plurality of sets of dies 443 can have corresponding address locations such that each row of memory cells in each of the plurality of sets of dies 443 is accessed at a same or similar rate.

Each of the plurality of sets of dies 443 can be associated with a particular set of bits of data. For example, a first set of dies 443-1 can be associated with data bits [15:0] (e.g., "DATA [15:0]"). A second set of dies 443-2 can be associated with data bits [31:16] (e.g., "DATA [31:16]"). A third set of dies 443-3 can be associated with data bits [47:32] (e.g., "DATA [47:32]"). A fourth set of dies 443-4 can be associated with data bits [N–1:N–32] (e.g., "DATA [N–1: N–32]"), which illustrates that any number of sets of dies can be used in the examples described herein. Each of the plurality of sets of dies 443 are able to send an alert signal 449 through resistor 447 to a memory controller. The alert signal 449 can be sent in response to a particular address location being accessed a threshold quantity of times. At least one of the dies of each of the plurality of sets of dies can be a row hammer refresh ("RHR") die and can be detecting and monitoring the quantity of accesses per groups of memory cells (e.g., per row of memory cells).

In response to detection that a particular address location of memory cells has been accessed a threshold quantity of times, the alert signal is sent form that particular set of dies. The memory controller, in response to receiving the alert signal 449, can perform a refresh operation on each corresponding particular address location that was accessed the threshold quantity of times, even if any one of the sets of dies did not send the alert signal. Since each of plurality of sets of dies has corresponding address locations and is accessed in a same or similar fashion, an alert signal from one dies of one set of dies indicates to perform the refresh operation on all corresponding address locations in all of the plurality of sets of dies.

In some embodiments, a subset of the plurality of sets of dies can have corresponding address locations. For example, sets of dies 443-1 and 443-2 may have corresponding address locations and sets of dies 443-3 and 443-4 may have corresponding address locations. In this example, an alert signal from sets of dies 443-1 may cause a refresh operation to be performed in sets of dies 443-1 and 443-2 but not in sets of dies 443-3 and 443-4. Likewise, an alert signal sent from sets of dies 443-3 may cause a refresh operation in sets of dies 443-3 and 443-4 and not in sets of dies 443-1 and 443-2. In this way, portions of the module that contains the plurality of sets of dies 443 may be used for performing the refresh operation based on the alert signal without causing the entire module to have the refresh operation performed.

Figure 5:
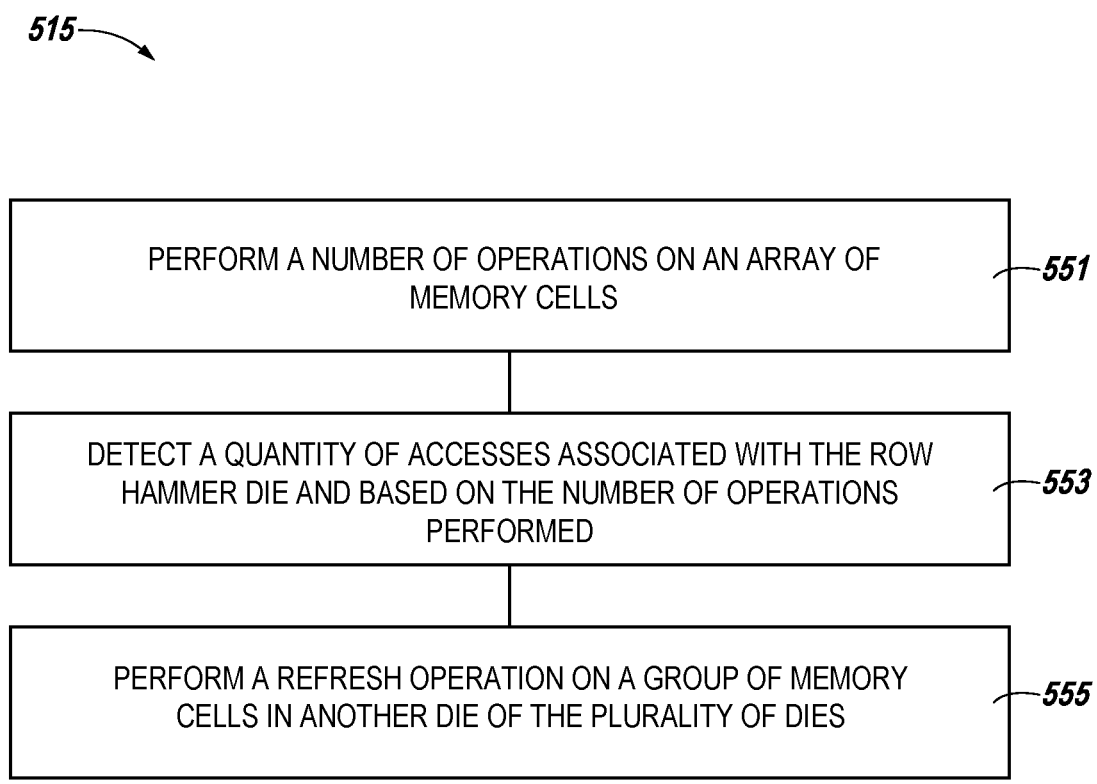
FIG. 5 illustrates a diagram representing an example method for a row hammer refresh operation in accordance with a number of embodiments of the present disclosure.

FIG. 5 illustrates a diagram representing an example method 515 for a row hammer refresh operation in accordance with a number of embodiments of the present disclosure. In some embodiments, a computer system (e.g., the computer system 100) can include a memory controller (e.g., the memory controller 115 of FIG. 1) and a processing device (e.g., the processing device 117 of FIG. 1). The memory controller can cause the processing device to perform the refresh operation in accordance with the description above.

At 551, the method 515 describes that the memory controller can cause performance of a number of operations on an array of memory cells. A plurality of dies can each comprise a plurality of arrays of memory cells (which includes the array of memory cells) of a memory device. At least one of the plurality of dies can be a row hammer die. An alert signal can be sent from the row hammer die in response to the threshold quantity of accesses being detected. In some examples, a memory controller can be coupled to the array of memory cells and can be configured to perform the operations described herein.

At 553, the method 515 describes that the memory controller can cause performance of a detection of a quantity of accesses associated with the row hammer die and which is based on the number of operations performed. Further, the method 515 describes that the accesses of the memory cells in dies of the plurality of dies other than the row hammer die are not detected. In some examples of the method 515, there is one row hammer die per memory channel and memory rank.

At 555, the method 515 describes that the memory controller can cause performance of a refresh operation on a group of memory cells in an additional die of the plurality of dies in response to detection of a threshold quantity of accesses of a group of memory cells in the row hammer die. In some examples, the group of memory cells are memory cells coupled to a same access line. The memory controller can receive a command to perform the refresh operation. In some examples, the memory device can be a Compute Express Link (CXL) compliant memory device.

In some examples, the method 515 can include the memory controller causing performance of a refresh operation on a group of memory cells in the row hammer die in response to detection of the threshold quantity of accesses of the group of memory cells in the row hammer die. In some examples, the memory controller can cause performance of the refresh operation on the group of memory cells in the additional die and performance of the refresh operation on the group of memory cells in the row hammer die are performed concurrently. In some examples, the method 515 can include the memory controller causing performance of the refresh operation on corresponding groups of memory cells of other dies of the plurality of dies in response to receiving the alert signal, wherein the corresponding groups of memory cells are associated with a same address location as the group of memory cells in the row hammer die.

Although specific embodiments have been illustrated and as described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a plurality of dies each comprising a plurality of arrays of memory cells of a memory device, wherein at least one of the plurality of dies but less than all of the plurality of dies, is a row hammer die, including access circuitry to detect and monitor a quantity of access groups of memory cells, and capable of performing a deterministic row hammer refresh; and
   a memory controller coupled to the array of memory cells, the memory controller configured to:
   perform a number of operations on the array of memory cells;
   detect a quantity of accesses associated with the row hammer die and based on the number of operations performed; and
   in response to detection of a threshold quantity of accesses of a group of memory cells in the row hammer die, perform a refresh operation on a group of memory cells in an additional die of the plurality of dies.

2. The apparatus of claim 1, wherein the controller is configured to, in response to detection of the threshold quantity of accesses of the group of memory cells in the row hammer die, perform a refresh operation on the group of memory cells in the row hammer die.

3. The apparatus of claim 2, wherein the refresh operation performed on the group of memory cells in the additional die and the refresh operation performed on the group of memory cells in the row hammer die are performed concurrently.

4. The apparatus of claim 1, wherein the controller is configured to perform the refresh operation on an additional group of memory cells adjacent to the group of memory cells.

5. The apparatus of claim 1, wherein the row hammer die is configured to send an alert signal in response to the threshold quantity of accesses being detected.

6. The apparatus of claim 5, wherein the memory controller is further configured to cause performance of a refresh operation on corresponding groups of memory cells of other dies of the plurality of dies in response to receiving the alert signal, wherein the corresponding groups of memory cells are associated with a same address location as the group of memory cells in the row hammer die.

7. The apparatus of claim 1, wherein the group of memory cells are memory cells coupled to a same access line.

8. The apparatus of claim 1, wherein the accesses of the memory cells in dies of the plurality of dies other than the row hammer die are not detected.

9. The apparatus of claim 1, wherein there is one row hammer die per memory channel and memory rank.

10. A method, comprising:
    performing a number of operations on an array of memory cells, wherein the array of memory cells are within a plurality of dies and at least one of the plurality of dies, but less than all of the dies is a row hammer die;
    detecting a quantity of accesses associated with the row hammer die and based on the number of operations performed, wherein a quantity of accesses of dies of the plurality of dies other than the row hammer die is not detected; and
    in response to detection of a threshold quantity of accesses of a group of memory cells in the row hammer die, performing a refresh operation on a group of memory cells in dies other than the row hammer die.

11. The method of claim 10, further comprising, in response to detection of the threshold quantity of accesses of the group of memory cells of the row hammer die, sending an alert signal to the dies other than the row hammer die to perform the refresh operation.

12. The method of claim 11, wherein the alert pin is asserted low in response to the detection of the threshold quantity of accesses of the group of memory cells in the row hammer die.

13. The method of claim 10, wherein addresses of the dies other than the row hammer die correlate to addresses of the row hammer die.

14. The method of claim 10, wherein the detection of the quantity of accesses associated with the row hammer die is performed without detecting a quantity of accesses of other dies of the plurality of dies.

15. A memory device, comprising:
    a plurality of sets of dies each comprising a plurality of arrays of memory cells of a memory device, wherein at least one die of each of the sets of dies but less than all die is a row hammer die including access circuitry to detect and monitor a quantity of accesses of a group of memory cells; and
    a memory controller coupled to the plurality of sets of dies, the memory controller configured to:
    perform a number of operations on each of the sets of dies of the memory device;
    detect a quantity of accesses associated with each respective row hammer die of each respective set of dies, wherein each of the quantity of accesses is based on the number of operations performed; and
    in response to detection of a threshold quantity of accesses of a group of memory cells in at least one particular row hammer die of at least one set of dies, perform a refresh operation on a group of memory cells in an additional die of the at least one set of dies other than the one particular row hammer die.

16. The apparatus of claim 15, wherein the group of memory cells in the additional die is at an address location that corresponds to the group of memory cells that received the threshold quantity of accesses.

17. The apparatus of claim 16, wherein the group of memory cells in the additional die as at an address location that is adjacent to the corresponding address location of the group of memory cells that received the threshold quantity of accesses.

18. The apparatus of claim 15, wherein the memory controller is further configured to receive an alert signal in response to detection of the threshold quantity of accesses of the group of memory cells in the at least one particular row hammer die.

19. The apparatus of claim 18, wherein the memory controller is configured to cause a refresh operation to occur in an additional set of dies other than the at least one set of dies.

20. The apparatus of claim 18, wherein the memory controller is configured to cause a refresh operation to occur in additional sets of dies other than the at least one set of dies at groups of memory cells that each correspond to a same address location that received the threshold quantity of accesses.

* * * * *